(12) United States Patent
Kim et al.

(10) Patent No.: US 9,543,518 B2
(45) Date of Patent: Jan. 10, 2017

(54) VAPOR DEPOSITION APPARATUS, DEPOSITION METHOD USING THE SAME, AND METHOD OF MANUFACTURING ORGANIC LIGHT-EMITTING DISPLAY APPARATUS

(71) Applicant: Samsung Display Co., Ltd., Gyeonggi-do (KR)

(72) Inventors: Jae-Hyun Kim, Yongin (KR); Myung-Soo Huh, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 14/250,697

(22) Filed: Apr. 11, 2014

(65) Prior Publication Data

US 2014/0322849 A1    Oct. 30, 2014

(30) Foreign Application Priority Data

Apr. 25, 2013    (KR) .......................... 10-2013-0046211

(51) Int. Cl.
| | | |
|---|---|---|
| *H01L 51/00* | (2006.01) | |
| *H01L 51/56* | (2006.01) | |
| *C23C 16/40* | (2006.01) | |
| *C23C 16/455* | (2006.01) | |

(52) U.S. Cl.
CPC ......... *H01L 51/0008* (2013.01); *C23C 16/403* (2013.01); *C23C 16/45542* (2013.01); *C23C 16/45551* (2013.01); *H01L 51/56* (2013.01)

(58) Field of Classification Search
None
See application file for complete search history.

(56) References Cited

U.S. PATENT DOCUMENTS

| | | |
|---|---|---|
| 2010/0068413 A1 | 3/2010 | Lee |
| 2011/0076421 A1 | 3/2011 | Lee |
| 2011/0193067 A1* | 8/2011 | Lee ..................... H01L 51/5256 257/40 |
| 2012/0040536 A1* | 2/2012 | Furuta ................... C23C 16/345 438/791 |
| 2012/0094149 A1* | 4/2012 | Lee ....................... C23C 16/403 428/701 |

FOREIGN PATENT DOCUMENTS

| | | |
|---|---|---|
| KR | 10-2010-0020919 A | 2/2010 |
| KR | 10-2012-0034705 A | 4/2012 |
| KR | 10-2012-0056878 A | 6/2012 |
| WO | WO 2010/019008 A2 | 2/2010 |

* cited by examiner

*Primary Examiner* — Calvin Choi
*Assistant Examiner* — Xiaoming Liu
(74) *Attorney, Agent, or Firm* — Lee & Morse, P.C.

(57) ABSTRACT

A vapor deposition apparatus for forming a deposition layer on a substrate includes a supply unit that is supplied with a first raw gas to form the deposition layer and an auxiliary gas, wherein the auxiliary gas does not constitute a raw material to form the deposition layer, a reaction space that is connected to the supply unit to be supplied with the first raw gas and the auxiliary gas, a plasma generator in the reaction space to convert at least a portion of the first raw gas into a radical form, and a first injection portion that is connected to the reaction space and that supplies at least a radical material of the first raw gas toward the substrate.

6 Claims, 3 Drawing Sheets

VAPOR DEPOSITION APPARATUS, DEPOSITION METHOD USING THE SAME, AND METHOD OF MANUFACTURING ORGANIC LIGHT-EMITTING DISPLAY APPARATUS

CROSS-REFERENCE TO RELATED APPLICATION

Korean Patent Application No. 10-2013-0046211, filed on Apr. 25, 2013, in the Korean Intellectual Property Office, and entitled: "Vapor Deposition Apparatus, Deposition Method Using the Same, and Method of Manufacturing Organic Light Emitting Display Apparatus," is incorporated by reference herein in its entirety.

BACKGROUND

1. Field

Embodiments relate to a vapor deposition apparatus and a method of manufacturing an organic light-emitting display apparatus.

2. Description of the Related Art

A semiconductor device, a display apparatus, other electronic devices, or the like includes a plurality of thin films. The plurality of thin films may be formed by using various methods, such as a vapor deposition method.

Among display apparatuses, an organic light-emitting display apparatus has wide viewing angles, high contrast, and fast response speeds and thus has received attention as a next generation display apparatus.

The organic light-emitting display apparatus includes an intermediate layer between opposite first and second electrodes, and one or more various types of thin films, wherein the intermediate layer includes an organic emission layer. A deposition process may be used to form the thin films of the organic light-emitting display apparatus.

SUMMARY

Embodiments are directed to a vapor deposition apparatus for forming a deposition layer on a substrate, the vapor deposition apparatus including a supply unit that is supplied with a first raw gas to form the deposition layer and with an auxiliary gas, a reaction space that is connected to the supply unit to be supplied with the first raw gas and the auxiliary gas, a plasma generator in the reaction space to convert at least a portion of the first raw gas into a radical form, and a first injection portion that is connected to the reaction space and that supplies at least a radical material of the first raw gas toward the substrate.

The auxiliary gas may include He or Ne.

The plasma generator may have an electrode form.

The plasma generator may have a pillar shape.

A connecting passage may be between the reaction space and the first injection portion, the connecting passage having a narrower width than the reaction space and the first injection portion.

The substrate and the vapor deposition apparatus may be movable relative to each other.

The vapor deposition apparatus may further include a second injection portion that is adjacent to and spaced apart from the first injection portion.

The second injection portion may inject a second raw material toward the substrate to form another deposition layer.

The vapor deposition apparatus may further include a plurality of purge portions between the first and second injection portions and adjacent to the first and second injection portions.

The purge portions may supply a purge gas including an inactive gas toward the substrate.

The purge gas may include He or Ne.

The vapor deposition apparatus may further include a plurality of exhaust portions adjacent to the first injection portion, the second injection portion, and the purge portions.

The plurality of exhaust portions may be between the first injection portion and the purge portions and between the second injection portion and the purge portions.

Embodiments are also directed to a deposition method for forming a deposition layer on a substrate, including supplying a first raw gas to form the deposition layer and an auxiliary gas from a supply unit to a reaction space, generating plasma by operating a plasma generator disposed in the reaction space to convert at least a portion of the first raw gas into a first raw material having a radical form, and supplying the first raw material to the substrate.

The auxiliary gas may include He or Ne.

The deposition method may further include injecting a purge gas including He or Ne toward the substrate through an area spaced apart from the reaction space.

Embodiments are also directed to a method of manufacturing an organic light-emitting display apparatus including a substrate, a first electrode, an intermediate layer including an organic emission layer, a second electrode, and an encapsulation layer by operating a vapor deposition apparatus. The method includes forming at least one thin film of the organic light-emitting display apparatus, forming the at least one thin film include positioning the substrate such that the substrate corresponds to the vapor deposition apparatus, supplying a first raw gas for forming a deposition layer and an auxiliary gas from a supply unit of the vapor deposition apparatus to a reaction space, generating plasma by operating a plasma generator disposed in the reaction space to convert at least a portion of the first raw gas into a first raw material having a radical form, and supplying the first raw material to the substrate.

Forming of thin film of the organic light-emitting display apparatus may include forming the encapsulation layer disposed on the second electrode.

Forming the thin film of the organic light-emitting display apparatus may include forming an insulating layer.

Forming the thin film of the organic light-emitting display apparatus may include forming a conductive layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
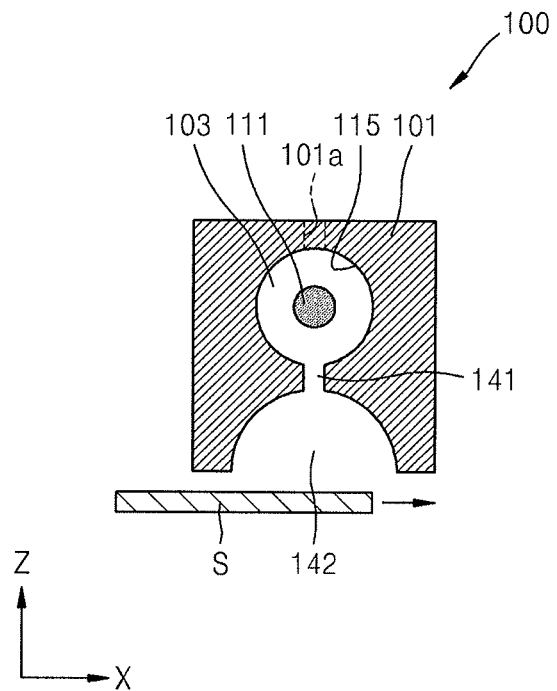
FIG. 1 illustrates a schematic cross-sectional view depicting a vapor deposition apparatus according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

FIG. 1 illustrates a schematic cross-sectional view depicting a vapor deposition apparatus 100 according to an exemplary embodiment.

Referring to FIG. 1, the vapor deposition apparatus 100 may include a housing 101, a supply unit 101*a*, a plasma generator 111, a reaction space 103, and an injection portion 142.

The housing 101 may be formed of a durable material to maintain a whole shape and an external appearance of the vapor deposition apparatus 100. The housing 101 may be formed in various shapes such as, for example, in a similar shape to a rectangular parallelepiped.

The supply unit 101*a* is disposed to be connected to the housing 101. For example, the supply unit 101*a* may be disposed in an upper surface of the housing 101 and may have a via hole shape to supply one or more raw gases. The number of supply units 101*a* may be variously determined according to a size of a material with which a deposition process is performed and which is to be deposited. The supply unit 101*a* is supplied with a raw gas and an auxiliary gas and transmits the raw gas and the auxiliary gas to the reaction space 103. The raw gas may be a gas including oxygen, for example, $H_2O$, $O_2$, $N_2O$, or the like. The auxiliary gas may be He or Ne, as examples.

The plasma generator 111 is disposed in the housing 101 and may be in a form of an electrode that is supplied with a voltage. The plasma generator 111 may have a pillar shape. For example, the plasma generator 111 may have a shape of a cylinder.

A facing surface 115 may face the reaction space 103 and the plasma generator 111. In other implementations, the facing surface 115 may have an electrode shape corresponding to the plasma generator 111. The facing surface 115 may be a ground electrode.

Plasma may be generated in a space between the plasma generator 111 and the facing surface 115, i.e., in the reaction space 103 that will be described below. The raw gas flowing in through the supply unit 101*a* may be converted into a radical form in the space between the plasma generator 111 and the facing surface 115 to improve a deposition characteristic.

The reaction space 103 may be formed in the housing 101 and may be connected to the supply unit 101*a*. The reaction space 103 may be defined as the space between the plasma generator 111 and the facing surface 115.

The injection portion 142 may be formed to be connected to the reaction space 103. The raw gas flowing in through the supply unit 101*a* may be converted into the radical form in the reaction space 103, transmitted to the injection portion 142, and supplied from the injection portion 142 to a substrate S on which deposition is performed. Thereby, a deposition process may be performed with respect to a surface of the substrate S. The injection portion 142 may connected to the reaction space 103 through a connecting passage 141. The connecting passage 141 may have a narrower width than the injection portion 142 and the reaction space 103.

The raw gas may be induced to sufficiently stay in the reaction space 103 in order to increase an amount of conversion of the raw gas into the radical form of the raw gas, such that a deposition raw material may be effectively transmitted to the injection portion 142.

A deposition method using the vapor deposition apparatus 100 will now be described.

When the substrate S on which deposition is to be performed is disposed to correspond to the injection portion 142 of the vapor deposition apparatus 100, the deposition process is performed with respect to the substrate S. The term "correspond to the injection portion" refers to the substrate S being located such that at least a portion of the substrate S is in a suitable position for receiving the deposition raw material from the injection portion. The substrate S may have a size such that only a portion of the substrate S may correspond to the injection portion at a time. The substrate S and the vapor deposition apparatus 100 may move relative to each other so as to perform the deposition process over the entire substrate over time. The substrate S may move in an X axis direction of FIG. 1 so as to continuously perform the deposition process. In other implementations, the vapor deposition apparatus 100 may move or the deposition process may be performed when the substrate S and the vapor deposition apparatus 100 do not move.

One or more raw gases and auxiliary gases may flow into the reaction space 103 through the supply unit 101*a*. The plasma may be generated in the reaction space 103 by the plasma generator 111, and at least a portion of the raw gas flowing into the reaction space 103 may be converted into a radical form. A raw material having a radical form may reach the substrate S to form a deposited layer including the raw material.

The auxiliary gas supplied with the raw gas through the supply unit 101*a* may collide with the raw gas in the reaction space 103 to improve a conversion rate of the raw gas into a radical form.

The auxiliary gas may include He. He has high first ionization energy that is 24.59 eV. Damage to an upper surface of the substrate S or a thin film pre-formed on the upper surface of the substrate S that could be caused by a collision with He ionized in the reaction space 103 may be prevented or reduced. The high ionization energy of He may prevent the ionization rate of He from excessively increasing in the reaction space 103.

He has a low molecular weight of 4.0026. Accordingly, the auxiliary gas including He increases an effect of preventing damage to the upper surface of the substrate S or the thin film pre-formed on the upper surface of the substrate S due to the collision with He.

Also, if a gas including oxygen, for example, $N_2O$, is used as a raw gas, oxygen ions generated through a generation of plasma in the reaction space 103 or oxygen having a radical form could abnormally accelerate, advance toward the substrate S, and collide with the upper surface of the substrate S or the thin film pre-formed on the upper surface of the substrate S, thereby damaging the upper surface of the substrate S or the thin film. However, in the present exemplary embodiment, the auxiliary gas, in particular, the auxiliary gas including He, may collide with oxygen ions or oxygen having a radical form to prevent the oxygen ions or the oxygen from abnormally accelerating. Therefore, damage to the upper surface of the substrate S or the thin film pre-formed on the upper surface of the substrate S may be prevented or reduced, and a characteristic of a deposited layer to be formed may be subsequently improved through the raw gas.

Figure 2:
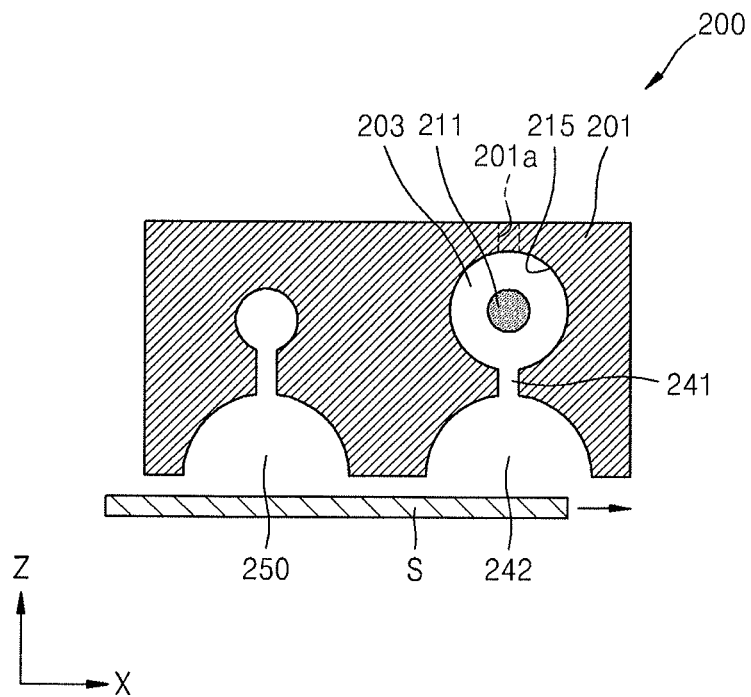
FIG. 2 illustrates a schematic plan view depicting a vapor deposition apparatus according to another exemplary embodiment.

FIG. 2 illustrates a schematic plan view depicting a vapor deposition apparatus 200 according to another exemplary embodiment.

Referring to FIG. 2, the vapor deposition apparatus 200 may include a housing 201, a supply unit 201a, a plasma generator 211, a reaction space 203, a first injection portion 242, and a second injection portion 250.

The housing 201 may be formed of a durable material to maintain a whole shape and an external appearance of the vapor deposition apparatus 200. The housing 201 may be formed in various shapes, for example, in a similar shape to a rectangular parallelepiped.

The supply unit 201a may be disposed to be connected to the housing 201. For example, the supply unit 201a may be disposed in an upper surface of the housing 201 and may be shaped as a via hole to supply one or more raw gases. The number of supply units 201a may be variously determined according to a size of a substrate S with respect to which a deposition process is performed to deposit a layer. The supply unit 201a may be supplied with a first raw gas and an auxiliary gas and may transmit the first raw gas and the auxiliary gas to the reaction space 203. The first raw gas may be a gas including oxygen, for example, e $H_2O$, $O_2$, $N_2O$, or the like. The auxiliary gas may be He.

The plasma generator 211 may be disposed in the housing 201 and may be in a form of an electrode that is supplied with a voltage. The plasma generator 211 may have a pillar shape. For example, the plasma generator 211 may have a shape of a cylinder.

A facing surface 215 may face the reaction space 203 and the plasma generator 211. In other implementations, the facing surface 215 may have an electrode form corresponding to the plasma generator 211. The facing surface 215 may be a ground electrode.

Plasma may be generated in a space between the plasma generator 211 and the facing surface 215, i.e., in the reaction space 203 that will be described below. The first raw gas flowing in through the supply unit 201a may be converted into a radical form in the space between the plasma generator 211 and the facing surface 215 to improve a deposition characteristic.

The reaction space 203 may be formed in the housing 201 and may be connected to the supply unit 201a. The reaction space 203 may be defined as the space between the plasma generator 211 and the facing surface 215.

The first injection portion 242 may be formed to be connected to the reaction space 203. The first raw gas flowing in through the supply unit 201a may be converted into the radical form in the reaction space 203, transmitted to the first injection portion 242, and supplied from the first injection portion 242 to the substrate S on which deposition is performed. Thereby, the deposition process may be performed with respect to a surface of the substrate S. The first injection portion 242 may be connected to the reaction space 203 through a connecting passage 241. The connecting passage 241 may have a narrower width than the first injection portion 242 and the reaction space 203.

The raw gas may be induced to sufficiently stay in the reaction space 203 in order to increase an amount of conversion of the raw gas into a radical form such that a deposition raw material may be effectively transmitted to the first injection portion 242.

The second injection portion 250 may be formed to be adjacent to the first injection portion 242. The second injection portion 250 may be spaced apart from the first injection portion 242. The second injection portion 250 may have a same structure as the first injection portion or may have a different structure.

The second injection portion 250 may inject a second raw material, which is to be deposited on the substrate S, toward the substrate S. For this purpose, the second injection portion 250 may be formed to be supplied with the second raw material.

A deposition method using the vapor deposition apparatus 200 of the present exemplary embodiment will now be described in brief.

When the substrate S on which deposition is to be performed is disposed to correspond to the second injection portion 250 of the vapor deposition apparatus 200, the second injection portion 250 may inject the second raw material, for example, the second raw material that is in a gaseous state, toward the substrate S.

Figure 4:
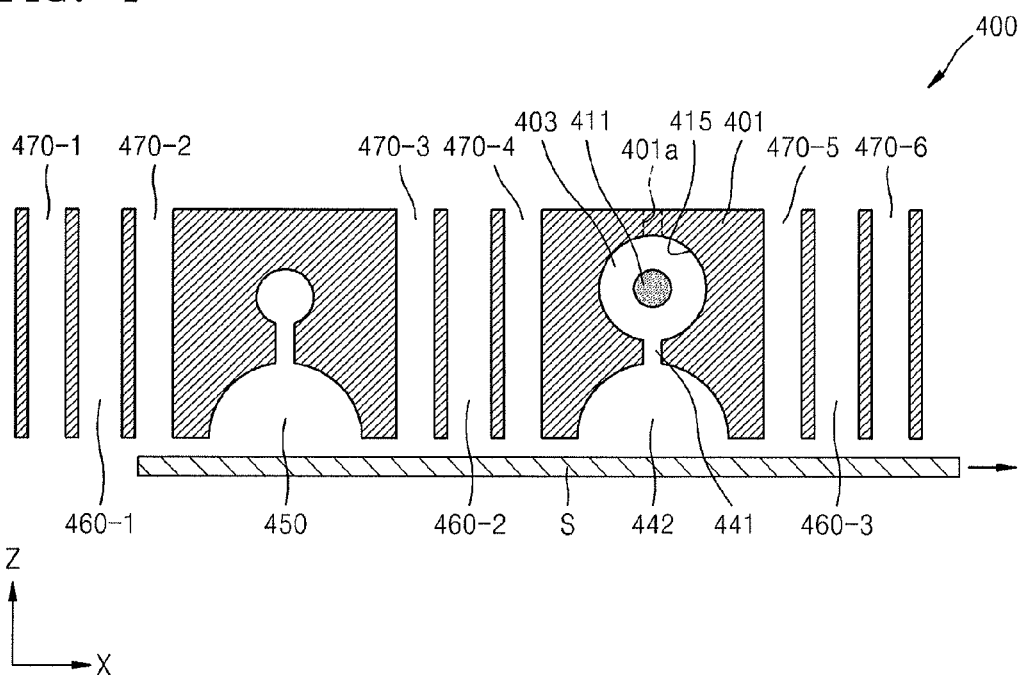
FIG. 4 illustrates a schematic plan view depicting a vapor deposition apparatus according to another exemplary embodiment.

If the substrate S moves in the X axis direction of FIG. 4, i.e., in a direction indicated by an arrow, to be disposed so as to correspond to the first injection portion 242, the first raw gas may flow into the reaction space 203. The substrate S and the vapor deposition apparatus 200 may move relative to each other to perform the deposition process. The substrate S may move in the X axis direction of FIG. 2 so as to continuously perform the deposition process. In other implementations, the vapor deposition apparatus 200 may move or the substrate S and the vapor deposition apparatus 200 may remain stationary while performing the deposition process.

In detail, one or more first raw gases and an auxiliary gas may flow into the reaction space 203 through the supply unit 201a. Plasma may be generated in the reaction space 203 by the plasma generator 211, and at least a portion of the first raw gas flowing into the reaction space 203 may be converted into a radical form. A raw material having a radical form may reach the substrate S to form a deposition layer including the raw material.

The auxiliary gas supplied along with the first raw gas through the supply unit 201a may collide with the first raw gas in the reaction space 203 to improve a conversion rate of the first raw gas into the radical form.

In particular, the auxiliary gas may include He. He has an ionization energy of 24.59 eV. An ionization rate of He may be prevented from excessively increasing in the reaction space 203 due to the high energy required for ionization of He. Accordingly, collisions of ionized He ionized in the reaction space 203 with the upper surface of the substrate S or the thin film pre-formed on the upper surface of the substrate S, and consequent damage to the upper surface of the substrate S or the thin film may be prevented or hindered.

He has a relatively low molecular weight of 4.0026. Even if the auxiliary gas including He were to collide with the upper surface of the substrate S or the thin film, an amount of shock thereof may be reduced.

If a gas, including oxygen, for example, $N_2O$, is used as a first raw gas, oxygen ions generated by generating plasma in the reaction space 203 or oxygen having a radical form could abnormally accelerate, advance toward the substrate S, and collide with the upper surface of the substrate S or the thin film, thereby damaging the upper surface or the thin film. However, in the present exemplary embodiment, the auxiliary gas, in particular, the auxiliary gas including He, may be prevented from colliding with oxygen ions or oxygen having a radical form, and thus, from abnormally accelerating. Damage to the upper surface of the substrate S or the thin film may be prevented or reduced, and a characteristic of a deposition layer, which will be subsequently formed through the first raw gas, may be improved.

Figure 3:
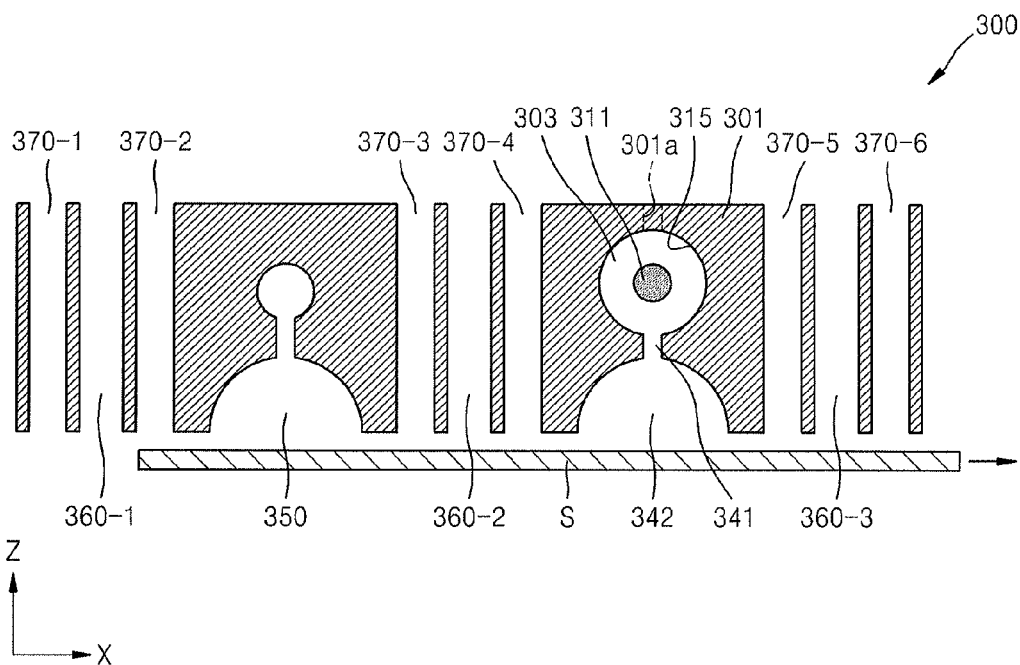
FIG. 3 illustrates a schematic plan view depicting a vapor deposition apparatus according to another exemplary embodiment.

FIG. 3 illustrates a schematic plan view depicting a vapor deposition apparatus 300 according to another exemplary embodiment.

Referring to FIG. 3, the vapor deposition apparatus 300 may include a housing 301, a supply unit 301a, a plasma generator 311, a reaction space 303, a first injection portion 342, a second injection portion 350, a plurality of purge portions 360-1, 360-2, and 360-3, and a plurality of exhaust portions 370-1, 370-2, . . . , 370-5, and 370-6.

The housing 301 may be formed of a durable material to maintain a whole shape and an external appearance of the vapor deposition apparatus 300. The housing 301 may be formed in various shapes, for example, in a similar shape to a rectangular parallelepiped.

The supply unit 301a may be disposed to be connected to the housing 301. For example, the supply unit 301a may be disposed in an upper surface of the housing 301 and may be shaped as a via hole to supply one or more raw gases. The number of supply units 301a may be variously determined according to a size of a substrate S with respect to which a deposition process is to be performed and on which a layer is to be deposited. The supply unit 301a may be supplied with a first raw gas and an auxiliary gas and may transmit the first raw gas and the auxiliary gas to the reaction space 303. The first raw gas may be a gas including oxygen, for example, $H_2O$, $O_2$, $N_2O$, or the like. The auxiliary gas may be He.

The plasma generator 311 may be disposed in the housing 301 and may be in a form of an electrode that is supplied with a voltage. The plasma generator 311 may have a pillar shape. For example, the plasma generator 311 may have a shape of a cylinder.

A facing surface 315 may face the reaction space 303 and the plasma generator 311. In other implementations, the facing surface 315 may have an electrode form facing the plasma generator 311. The facing surface 315 may be a ground electrode.

Plasma may be generated in a space between the plasma generator 311 and the facing surface 315, i.e., in the reaction space 303 that will be described below. The first raw gas flowing in through the supply unit 301a may be converted into a radical form in the space between the plasma generator 311 and the facing surface 115 to improve a deposition characteristic.

The reaction space 303 may be formed in the housing 301 and may be connected to the supply unit 301a. The reaction space 303 may be defined as the space between the plasma generator 311 and the facing surface 315.

The first injection portion 342 may be formed to be connected to the reaction space 303. The first raw gas flowing in through the supply unit 301a may be converted into the radical form in the reaction space 303, transmitted to the first injection portion 342, and supplied from the first injection portion 342 to the substrate S. Thereby, a deposition process may be performed with respect to a surface of the substrate S. The first injection portion 342 is connected to the reaction space 303 through a connecting passage 341, and the connecting passage 341 may have a narrower width than the first injection portion 342 and the reaction space 303.

The raw gas may be induced to sufficiently stay in the reaction space 303 to improve a conversion rate of the raw gas into a radical form such that the deposition raw material may be effectively transmitted to the first injection portion 342.

The second injection portion 350 is formed to be adjacent to the first injection portion 342. The second injection portion 350 may also be spaced apart from the first injection portion 342.

The second injection portion 350 may inject a second raw material, which is to be deposited on the substrate S, toward the substrate S. For this purpose, the second injection portion 350 may be formed to be supplied with the second raw material.

The plurality of purge portions 360-1, 360-2, and 360-3 may be disposed to be respectively adjacent to the first injection portion 342 and the second injection portion 350.

The purge portion 360-2 may be disposed between the first injection portion 342 and the second injection portion 350. The purge portion 360-1 may be disposed to be adjacent to the second injection portion 350. The purge portion 360-3 may be disposed to be adjacent to the first injection portion 342.

The plurality of purge portions 360-1, 360-2, and 360-3 inject a purge gas including an inactive gas toward the substrate S. For example, the plurality of purge portions 360-1, 360-2, and 360-3 may inject gases such as Ar, He, Ne, etc., as a purge gas.

For example, the plurality of purge portions 360-1, 360-2, and 360-3 may use He or Ne as the purge gas. He and Ne have a smaller molecular weight than Ar. When the purge gas collides with the substrate S, damage to the substrate S by the purge gas may be reduced or prevented. He and Ne respectively have first ionization energies of 24.59 eV and 21.56 eV that are higher than first ionization energy of Ar that is 15.76 eV. Therefore, if a purge gas including He or Ne is used, the ionization of the purge gas may be decreased to prevent the upper surface of the substrate S or the thin film pre-formed on the upper surface of the substrate S from being damaged and contaminated.

Although the purge gas including He or Ne flows around the first injection portion 342, the ionization of purge gas may be decreased to prevent the upper surface of the S or the thin film from being damaged and contaminated.

The plurality of exhaust portions 370-1, 370-2, . . . , 370-5, and 370-6 may be disposed to be respectively adjacent to the first injection portion 342, the second injection portion 350, and the plurality of purge portions 360-1, 360-2, and 360-3.

The first injection portion 342, the second injection portion 350, and the plurality of purge portions 360-1, 360-2, and 360-3 may not be directly adjacent to one another but may be adjacent to one another such that at least one of the plurality of exhaust portions 370-1, 370-2, . . . , 370-5, and 370-6 is interposed between the first injection portion 342, the second injection portion 350, and the plurality of purge portions 360-1, 360-2, and 360-3.

A deposition method using the vapor deposition apparatus 300 of the present exemplary embodiment will now be described in brief. A method of forming $Al_xO_y$ on the substrate S by using the vapor deposition apparatus 300 will be described as a detailed example.

When the substrate S is disposed to correspond to the second injection portion 350 of the vapor deposition apparatus 300, a second raw material, for example, a gas including an Al atom, such as trimethyl aluminum (TMA) in a gaseous state, may be transmitted from the second injection portion 350 toward the substrate S. An adsorption layer including Al may be formed on the upper surface of the substrate S. In detail, a chemical adsorption layer and a physical adsorption layer may be formed on the upper surface of the substrate S.

The physical adsorption layer, which is formed on the upper surface of the substrate S and has a weak intermolecular cohesion, may be separated from the substrate S by the purge gas injected into the purge portion 360-2 and effectively removed from the substrate S through pumping of the exhaust portions 370-2 and 370-3, thereby improving purity of a deposition layer that is to be finally formed on the substrate S.

When the substrate S is disposed to correspond to the first injection portion 342 of the vapor deposition apparatus 300, one or more first raw gases and an auxiliary gas may flow into the reaction space 303 through the supply unit 301a. In detail, the first raw gas may include oxygen, and may be, for example, $H_2O$, $O_2$, $N_2O$, or the like.

Plasma may be generated in the reaction space 303 by the plasma generator 311, and at least a portion of the first raw gas flowing into the reaction space 303 may be converted into a radical form. A material of the first raw gas converted into the radical form, i.e., a first raw material, may reach the substrate S to form a deposition layer including the first raw material.

The first raw material may react with a chemical adsorption layer formed of the second raw material that has been adsorbed on the substrate S or may replace a portion of the chemical adsorption layer, thereby finally forming $Al_xO_y$, as a desired deposition layer on the substrate S. An excess of the first raw material may form a physical adsorption layer and may remain on the substrate S.

The purge gas may be injected from the purge portion 360-2 or 360-3 toward the substrate S to separate the physical adsorption layer of the first raw material remaining on the substrate S from the substrate S. The purge gas may be effectively removed from the substrate S through pumping of the exhaust portions 370-4 and 370-5 to improve the purity of a deposition layer that is to be finally formed on the substrate S.

As a result, a deposition layer, including the first and second raw materials, may be formed on the substrate S. IA single atomic layer, including $Al_xO_y$, is formed on the substrate S.

The substrate S and the vapor deposition apparatus 300 may move relative to each other so as to perform a deposition process. As shown in FIG. 3, the substrate S may move in an X axis direction so as to continuously perform a deposition process. In other implementations, the vapor deposition apparatus 300 may move, or the substrate S and the vapor deposition apparatus 300 may not move so as to perform the deposition process.

FIG. 4 illustrates a schematic plan view depicting a vapor deposition apparatus 400 according to another exemplary embodiment.

Referring to FIG. 4, the vapor deposition apparatus 400 includes a housing 401, a supply unit 401a, a plasma generator 411, a reaction space 403, a first injection portion 442, a second injection portion 450, a plurality of purge portions 460-1, 460-2, and 460-3, and a plurality of exhaust portions 470-1, 470-2, . . . , 470-5, and 470-6.

The supply unit 401a may be disposed to be connected to the housing 401. For example, the supply unit 401a may be disposed in an upper surface of the housing 401 and may have be shaped as a via hole to supply one or more raw gases. The number of supply units 401a may be variously determined according to a size of a substrate S with respect to which a deposition process is to be performed and on which a layer is to be deposited. The supply unit 401a may be supplied with a first raw gas and an auxiliary gas and transmits the first raw gas and the auxiliary gas to the reaction space 403. The first raw gas may be a gas including oxygen, for example, $H_2O$, $O_2$, $N_2O$, or the like. The auxiliary gas may be Ne.

The auxiliary gas supplied along with the first raw gas through the supply unit 401a may collide with the first raw gas in the reaction space 403 to improve a conversion rate of the first raw gas into a radical form.

In particular, the auxiliary gas may include Ne. Ne has a high first ionized energy of 21.56 eV. An ionization rate of Ne may be prevented from excessively increasing in the reaction space 403 due to the high energy required for ionization of Ne. Accordingly, collisions of ionized Ne ionized in the reaction space 403 with an upper surface of the substrate S or a thin film pre-formed on the upper surface of the substrate S, and consequent damage to the upper surface of the substrate or the thin film may be prevented or reduced.

Also, if a gas, including oxygen, for example, $N_2O$, is used as the first raw gas, oxygen ions generated by generating plasma in the reaction space 403 or oxygen having a radical form could abnormally accelerate, advance toward the substrate S, and collide with the upper surface of the substrate S or the thin film, thereby damaging the upper surface of the substrate S or the thin film. However, in the present exemplary embodiment, the auxiliary gas, in particular, the auxiliary gas, including Ne, may be prevented from colliding with the oxygen ions or the oxygen having the radical form, and abnormal acceleration of the oxygen ions or the oxygen may be reduced or prevented. Therefore, damage to the upper surface of the substrate S or the thin film may be prevented or reduced, and a characteristic of a deposition layer that is to be subsequently formed of the first raw gas may be improved.

Other elements are the same as those of the previous exemplary embodiments described above, and thus their detailed descriptions will be omitted.

An auxiliary gas, including Ne, instead of He may be used in the vapor deposition apparatuses 100, 200, and 300 of FIGS. 1, 2, and 3.

Figure 5:
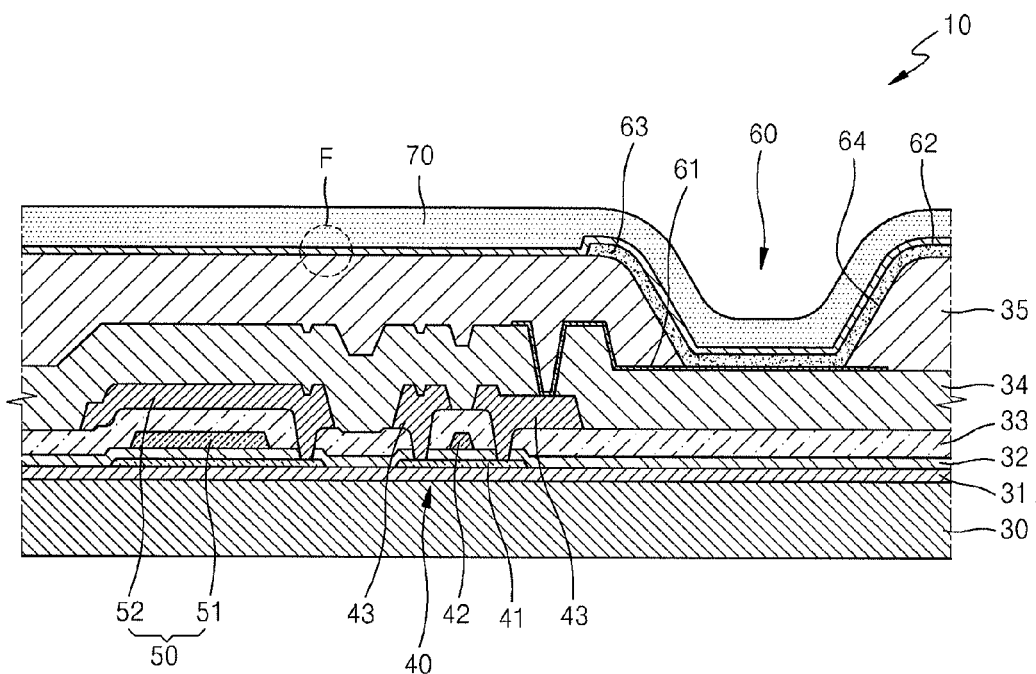
FIG. 5 illustrates a schematic cross-sectional view depicting an organic light-emitting display apparatus manufactured by a method of manufacturing an organic light-emitting display apparatus according to an exemplary embodiment.
Figure 6:
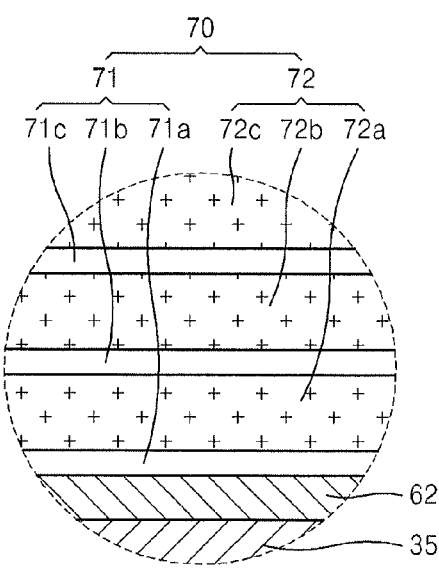
FIG. 6 illustrates an enlarged view of a portion F of FIG. 5.

FIG. 5 illustrates a schematic cross-sectional view depicting an organic light-emitting display apparatus 10 manufactured by a method of manufacturing an organic light-emitting display apparatus, according to an exemplary embodiment. FIG. 6 is an enlarged view of a portion F of FIG. 5.

In detail, FIGS. 5 and 6 illustrate an organic light-emitting display apparatus manufactured by using one of the vapor deposition apparatuses 100, 200, 300 and 400 described above.

The organic light-emitting display apparatus 10 may include a substrate 30. The substrate 30 may be formed of a glass material, a plastic material, or a metallic material.

A buffer layer 31 may be formed on the substrate 30 to provide a flat surface on the substrate 30 and prevent moisture and foreign substances from permeating into the substrate 30.

A thin film transistor (TFT) 40, a capacitor 50, and an organic light-emitting device 60 may be formed on the buffer layer 31. The TFT 40 may include an active layer 41, a gate electrode 42, and source/drain electrodes 43. The organic light-emitting device 60 may include a first electrode 61, a second electrode 62, and an intermediate layer 63.

The capacitor 50 may include a first capacitor electrode 51 and a second capacitor electrode 52.

In detail, the active layer 41 may be formed in a predetermined pattern and disposed on an upper surface of the buffer layer 31. The active layer 41 may include an inorganic semiconductor material such as silicon, an organic semiconductor material, or an oxide semiconductor material. Also, p-type or n-type dopants may be injected to form the active layer 41. The first capacitor electrode 51 is formed on the same layer as the active layer 41 and may be formed of the same material as that of which the active layer 41 is formed.

A gate insulating layer 32 may be formed on the active layer 41. The gate electrode 42 may be formed on the gate insulating layer 32 to correspond to the active layer 41. An interlayer insulating layer 33 may be formed to cover the gate electrode 42, and the source and drain electrodes 43 may be formed on the interlayer insulating layer 44 to contact a predetermined area of the active layer 41. The second capacitor electrode 52 may be formed on the same layer as the source/drain electrodes 43 and may be formed of the same material as the source/drain electrodes 43.

A passivation layer 34 may be formed to cover the source/drain electrodes 43, and an additional insulating layer may be formed on the passivation layer 34 to planarize the TFT 40.

The first electrode 61 may be formed on the passivation layer 34. The first electrode 61 may be formed to be electrically connected to one of the source/drain electrodes 43. A pixel-defining layer (PDL) 35 may be formed to cover the first electrode 61. A predetermined opening 64 may be formed in the PDL 35, and the intermediate layer 63, including an organic emission layer, may be formed in an area defined by the opening 64. The second electrode 62 may be formed on the intermediate layer 63.

A encapsulation layer 70 may be formed on the second electrode 62. The encapsulation layer 70 may include an organic material or an inorganic material and may have a structure in which an organic material and an inorganic material are alternately stacked.

The encapsulation layer 70 may be formed by using one of the vapor deposition apparatuses described above. The substrate 30, on which the second electrode 62 has been formed, may pass through one of the vapor deposition apparatuses described above to form a desired layer.

In particular, the encapsulation layer 70 may include an inorganic layer 71 and an organic layer 72. The inorganic layer 71 may include a plurality of layers 71a, 71b, and 71c, and the organic layer 72 may include a plurality of layers 72a, 72b, and 72c. The plurality of layers 71a, 71b, and 71c of the inorganic layer 71 may be formed by using a vapor deposition apparatus.

In other implementations, other insulating layers, such as the buffer layer 31, the gate insulating layer 32, the interlayer insulating layer 33, the passivation layer 34, the PDL 35, etc. of the organic light-emitting display apparatus 10, may be formed by using the vapor deposition apparatus.

Other thin films, such as the active layer 41, the gate electrode 42, the source and drain electrodes 43, the first electrode 61, the intermediate layer 63, the second electrode 62, etc., may also be formed by using the vapor deposition apparatus.

By way of summation and review, a vapor deposition method may use one or more gases as a raw material for forming the thin films. Examples of the vapor deposition method include various types of methods, such as chemical vapor deposition (CVD), atomic layer deposition (ALD), etc.

According to the ALD method, one raw material is injected, and purged/pumped, and then, one or more molecular layers are adsorbed on a substrate. Also, another type of raw material is injected, and purged/pumped to finally form one or more desired atomic layers.

A deposition process may be used to form the thin films of an organic light-emitting display apparatus. However, as the organic light-emitting display apparatus have become larger, with higher resolution, the deposition process as been used to form thin films having large areas. However, it is difficult deposit thin films having a large area, and ways to improve a process of forming the thin films may be limited.

Embodiments provide a vapor deposition apparatus that easily improves a deposition layer characteristic, a deposition method, and a method of manufacturing an organic light-emitting display apparatus.

If the vapor deposition apparatus is used, a characteristic of a deposition layer formed in the organic light-emitting display apparatus may be improved to improve an electrical characteristic and an image quality characteristic of the organic light-emitting display apparatus In a vapor deposition apparatus, a deposition method, and a method of manufacturing an organic light-emitting display apparatus according to the present invention, a characteristic of a deposition layer may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope as set forth in the following claims.

What is claimed is:

1. A deposition method for forming a deposition layer on a substrate, the method comprising:

supplying a first raw gas to form the deposition layer and an auxiliary gas, wherein the auxiliary gas includes helium or neon and does not constitute a raw material to form the deposition layer, from a supply unit to a reaction space;

generating plasma by operating a plasma generator disposed in the reaction space to convert at least a portion of the first raw gas into a first raw material having a radical form, wherein generating the plasma is carried out at an enemy below a first ionization enemy of the auxiliary gas such that the auxiliary gas remains substantially neutral when the first raw gas is converted into the first raw material in the radical form;

supplying the first raw material in the radical form and the auxiliary gas through a connecting passage to an injection portion, wherein the connecting passage is between the reaction space and the injection portion, the connecting passage having a narrower width than the injection portion and the reaction space such that the raw gas and the auxiliary gas are induced to sufficiently stay in the reaction space to convert at least the portion of the first raw gas into the first raw material having the radical form; and supplying the first raw material in the radical form and the auxiliary gas from the injection portion to the substrate.

2. The deposition method as claimed in claim 1, further comprising injecting a purge gas including He or Ne toward the substrate through an area spaced apart from the reaction space.

3. A method of manufacturing an organic light-emitting display apparatus including a substrate, a first electrode, an intermediate layer including an organic emission layer, a second electrode, and an encapsulation layer by operating a vapor deposition apparatus, the method comprising:

forming at least one thin film of the organic light-emitting display apparatus, wherein forming the at least one thin film includes:

positioning the substrate such that the substrate corresponds to the vapor deposition apparatus;

supplying a first raw gas for forming a deposition layer and an auxiliary gas, wherein the auxiliary gas includes helium or neon and does not constitute a raw material to form the deposition layer, from a supply unit of the vapor deposition apparatus to a reaction space;

generating plasma by operating a plasma generator disposed in the reaction space to convert at least a portion of the first raw gas into a first raw material having a radical form, wherein generating the plasma is carried out at an enemy below a first ionization enemy of the auxiliary gas such that the auxiliary gas remains substantially neutral when the first raw gas is converted into the first raw material in the radical form;

supplying the first raw material in the radical form and the auxiliary gas through a connecting passage to an injection portion, wherein the connecting passage is between the reaction space and the injection portion, the connecting passage having a narrower width than the injection portion and the reaction space such that the raw gas and the auxiliary gas are induced to sufficiently stay in the reaction space to convert at least the portion of the first raw gas into the first raw material having the radical form; and supplying the first raw material in the radical form and the auxiliary gas from the injection portion to the substrate.

4. The method as claimed in claim 3, wherein forming of thin film of the organic light-emitting display apparatus includes forming the encapsulation layer disposed on the second electrode.

5. The method as claimed in claim 3, wherein forming the thin film of the organic light-emitting display apparatus includes forming an insulating layer.

6. The method as claimed in claim 3, wherein forming the thin film of the organic light-emitting display apparatus is forming a conductive layer.

* * * * *

UNITED STATES PATENT AND TRADEMARK OFFICE
CERTIFICATE OF CORRECTION

| | | |
|---|---|---|
| PATENT NO. | : 9,543,518 B2 | Page 1 of 1 |
| APPLICATION NO. | : 14/250697 | |
| DATED | : January 10, 2017 | |
| INVENTOR(S) | : Jae-Hyun Kim et al. | |

It is certified that error appears in the above-identified patent and that said Letters Patent is hereby corrected as shown below:

In the Claims

In Claim 3, Column 14, Line 3:
"out at an enemy below a first ionization enemy of the"
Should read:
-- out at an energy below a first ionization energy of the --

Signed and Sealed this
Fourth Day of June, 2019

Andrei Iancu
*Director of the United States Patent and Trademark Office*